United States Patent
Huang et al.

(10) Patent No.: US 11,528,828 B2
(45) Date of Patent: Dec. 13, 2022

(54) ELECTRONIC DEVICE WITH HEAT-DISSIPATION STRUCTURE

(71) Applicant: Wistron NeWeb Corp., Hsinchu (TW)

(72) Inventors: Wei-Jie Huang, Hsinchu (TW); Chun-Yu Lee, Hsinchu (TW)

(73) Assignee: WISTRON NEWEB CORP., Hsinchu (TW)

(*) Notice: Subject to any disclaimer, the term of this patent is extended or adjusted under 35 U.S.C. 154(b) by 70 days.

(21) Appl. No.: 17/323,029

(22) Filed: May 18, 2021

(65) Prior Publication Data

US 2021/0392785 A1    Dec. 16, 2021

(30) Foreign Application Priority Data

Jun. 12, 2020 (TW) ................. 109119817

(51) Int. Cl.
| | |
|---|---|
| *H05K 7/20* | (2006.01) |
| *G06F 1/20* | (2006.01) |
| *H04M 1/02* | (2006.01) |

(52) U.S. Cl.
CPC ......... *H05K 7/20445* (2013.01); *G06F 1/203* (2013.01); *H04M 1/0249* (2013.01); *H05K 7/2039* (2013.01)

(58) Field of Classification Search
CPC ...................... G06F 1/20; G06F 1/203; H05K 7/2039–20518; H04M 1/0249
See application file for complete search history.

(56) References Cited

U.S. PATENT DOCUMENTS

| | | | |
|---|---|---|---|
| 5,931,514 A | 8/1999 | Chung | |
| 7,961,471 B2* | 6/2011 | Odanaka | ................... G06F 1/20 |
| | | | 174/547 |
| 8,014,135 B2 | 9/2011 | Yu | |
| 8,351,211 B2* | 1/2013 | Maeda | ............... H05K 7/20509 |
| | | | 361/752 |
| 9,485,884 B2* | 11/2016 | Bose | .................... H05K 7/2049 |

FOREIGN PATENT DOCUMENTS

| | | |
|---|---|---|
| TW | 353263 B | 2/1999 |
| TW | M366705 U1 | 10/2009 |

* cited by examiner

*Primary Examiner* — Zachary Pape
(74) *Attorney, Agent, or Firm* — McClure, Qualey & Rodack, LLP (57) ABSTRACT

An electronic device with a heat-dissipation structure is provided. The electronic device includes a housing, a heat-dissipation member, and a restriction member. The housing includes a first sidewall and a second sidewall. The first sidewall includes a first sidewall connection portion. The second sidewall includes a second sidewall connection portion. The heat-dissipation member includes a heat-dissipation member connection portion that is detachably connected to the first sidewall connection portion. The first sidewall connection portion restricts the freedom of movement of the heat-dissipation member connection portion in a first direction. The restriction member is disposed on the heat-dissipation member. The restriction member is wedged into the second sidewall connection portion. The second sidewall connection portion restricts the freedom of movement of the restriction member in the first direction.

16 Claims, 7 Drawing Sheets

ELECTRONIC DEVICE WITH HEAT-DISSIPATION STRUCTURE

CROSS REFERENCE TO RELATED APPLICATIONS

This application claims priority of Taiwan Patent Application No. 109119817, filed on Jun. 12, 2020, the entirety of which is incorporated by reference herein.

BACKGROUND OF THE INVENTION

Field of the Invention

The present invention relates to an electronic device, and in particular to an electronic device with a heat-dissipation structure.

Description of the Related Art

Most conventional electronic devices such as wireless routers have a housing. The housing is often made of metal, which can improve heat dissipation. A metal heat-dissipation member is disposed in the housing. The heat-dissipation member is commonly affixed to the housing with glue, and the heat-dissipation member and the housing must be held immobile for several hours to allow the glue to set. Additionally, a conventional heat-dissipation member cannot easily be detached from the housing, and it cannot be recycled.

BRIEF SUMMARY OF THE INVENTION

Embodiments of the invention are provided to address the aforementioned difficulties.

In one embodiment, an electronic device with a heat-dissipation structure is provided. The electronic device includes a housing, a heat-dissipation member and a restriction member. The housing includes a first sidewall and a second sidewall. The first sidewall comprises a first sidewall connection portion. The second sidewall comprises a second sidewall connection portion. The heat-dissipation member includes a heat-dissipation member connection portion. The heat-dissipation member connection portion is detachably connected to the first sidewall connection portion. The first sidewall connection portion restricts the freedom of movement of the heat-dissipation member connection portion in a first direction. The restriction member is disposed on the heat-dissipation member, wherein the restriction member is wedged into the second sidewall connection portion, and the second sidewall connection portion restricts the freedom of movement of the restriction member in the first direction.

In one embodiment, the first sidewall connection portion comprises a first sidewall recess, the heat-dissipation member connection portion comprises a heat-dissipation member protrusion, and the heat-dissipation member protrusion is adapted to be inserted into the first sidewall recess.

In one embodiment, in a restricted state, the restriction member is simultaneously wedged into the heat-dissipation member and the second sidewall connection portion.

In one embodiment, the restriction member is integrally formed on the heat-dissipation member, the restriction member comprises a cantilever beam, one end of the cantilever beam is connected to the heat-dissipation member, and the other end of the cantilever beam is adapted to be wedged into the second sidewall connection portion.

Utilizing the electronic device of the embodiment of the invention, the restriction member affixes the heat-dissipation member to the housing by wedging. The time and effort required for assembly is reduced. The reliability of the produce is improved. Additionally, the heat-dissipation member can easily be detached from the housing and be recycled.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
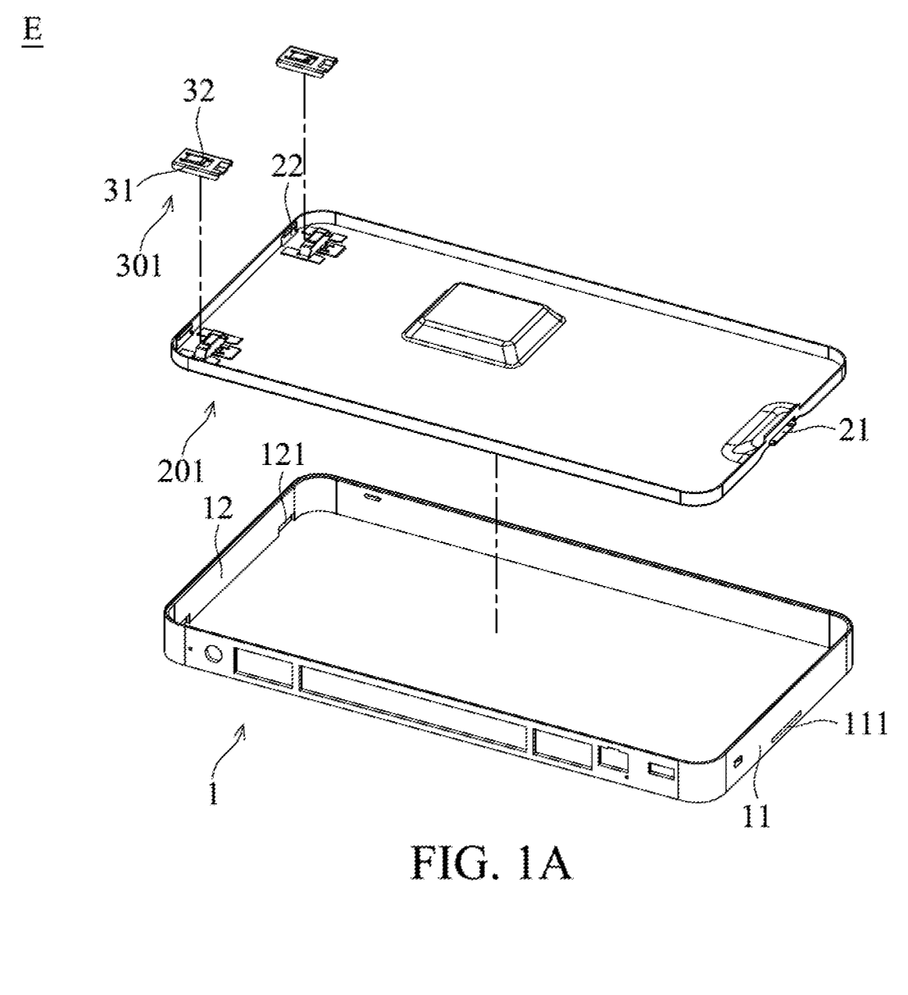
FIG. 1A is an exploded view of an electronic device with a heat-dissipation structure of a first embodiment of the invention.
Figure 1B:
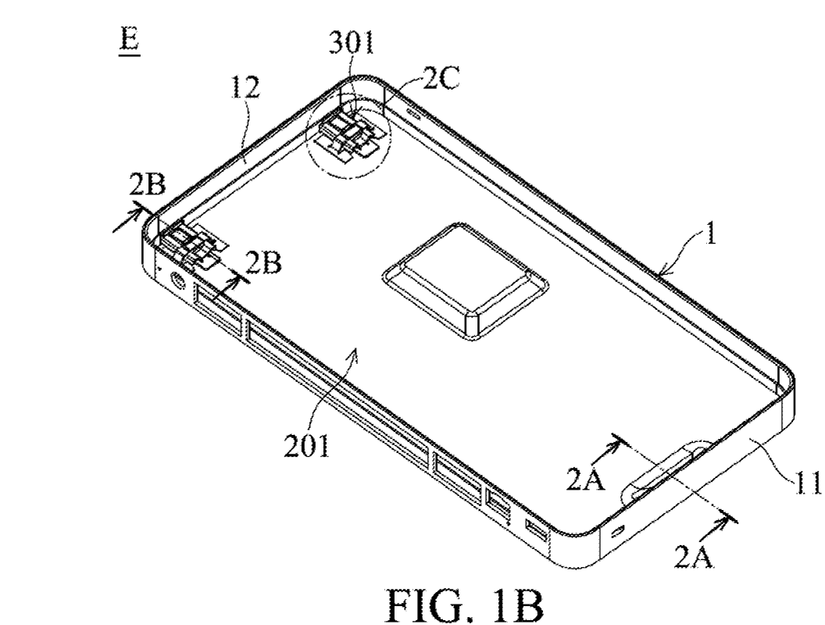
FIG. 1B is an assembled view of the electronic device of the first embodiment of the invention.

FIG. 1A is an exploded view of an electronic device with a heat-dissipation structure of a first embodiment of the invention. FIG. 1B is an assembled view of the electronic device of the first embodiment of the invention. With reference to FIGS. 1A and 1B, the electronic device E of the first embodiment of the invention includes a housing 1, a heat-dissipation member 201 and a restriction member 301. The housing 1 includes a first sidewall 11 and a second sidewall 12. The first sidewall 11 comprises a first sidewall connection portion 111, and the second sidewall 12 comprises a second sidewall connection portion 121.

Figure 2A:
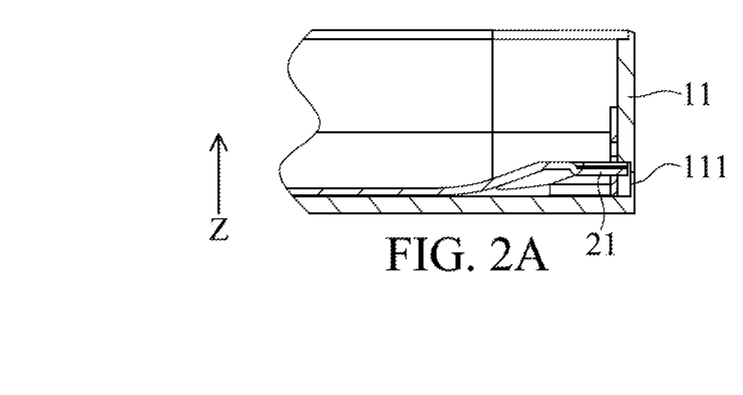
FIG. 2A shows the heat-dissipation member of the embodiment of the invention connected to the first sidewall.
Figure 2B:
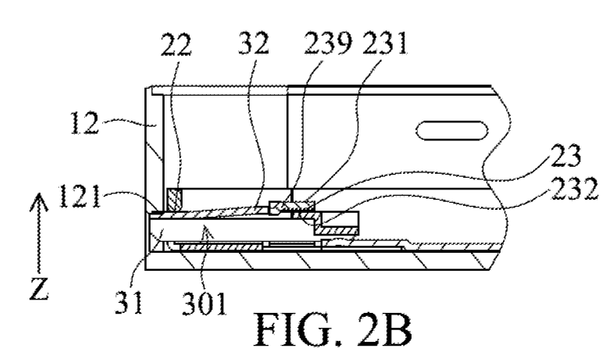
FIG. 2B shows the heat-dissipation member of the embodiment of the invention connected to the second sidewall.

FIG. 2A shows the heat-dissipation member of the embodiment of the invention connected to the first sidewall. FIG. 2B shows the heat-dissipation member of the embodiment of the invention connected to the second sidewall. With reference to FIGS. 1A, 1B, 2A and 2B, the heat-dissipation member 201 includes a heat-dissipation member connection portion 21. The heat-dissipation member connection portion 21 is detachably connected to the first sidewall connection portion 111. The first sidewall connection portion 111 restricts the freedom of movement of the heat-dissipation member connection portion 21 in the first direction Z. The restriction member 301 is disposed on the heat-dissipation member 201. The restriction member 301 is wedged into the second sidewall connection portion 121. The second sidewall connection portion 121 restricts the freedom of movement of the restriction member 301 in the first direction Z.

With reference to FIGS. 1A and 2A, in one embodiment, the first sidewall connection portion 111 is a first sidewall recess (111). The heat-dissipation member connection portion 21 is a heat-dissipation member connection protrusion (21). The heat-dissipation member connection protrusion (21) is adapted to be inserted into the first sidewall recess (111).

Figure 2C:
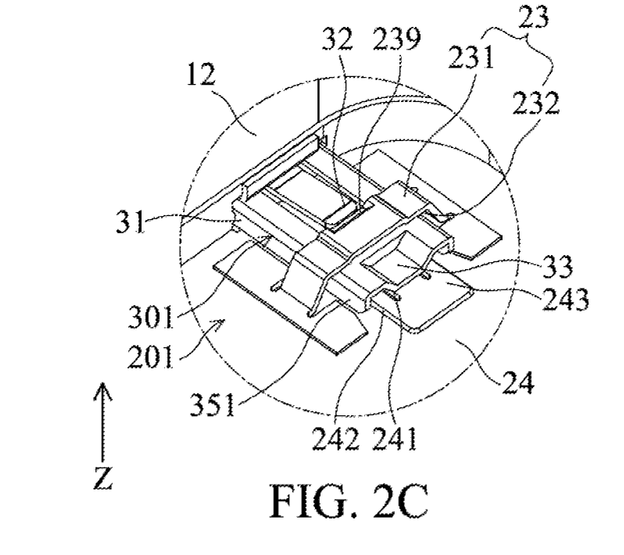
FIG. 2C is an enlarged view of a portion 2C of FIG. 1B.

FIG. 2C is an enlarged view of a portion 2C of FIG. 1B. With reference to FIGS. 2B and 2C, in one embodiment, in a restricted state, the restriction member 301 is simultaneously wedged into both the heat-dissipation member 201 and the second sidewall connection portion 121.

With reference to FIGS. 2B and 2C, in one embodiment, the restriction member 301 comprises a restriction member hook 32 and a restriction member connection portion 31. The heat-dissipation member 201 comprises a heat-dissipation member through hole 22 and a heat-dissipation member wedging portion 239. The restriction member connection portion 31 passes through the heat-dissipation member through hole 22 and is connected to the second sidewall connection portion 121. The restriction member hook 32 is wedged into the heat-dissipation member wedging portion 239.

With reference to FIGS. 2A and 2C, in one embodiment, the heat-dissipation member 201 comprises a bridge portion 23 and a heat-dissipation member plate 24. The heat-dissipation member wedging portion 239 is formed on the bridge portion 23. The bridge portion 23 is formed on the heat-dissipation member plate 24. The restriction member 301 extends between the bridge portion 23 and the heat-dissipation member plate 24.

With reference to FIGS. 2A and 2C, in one embodiment, the bridge portion 23 comprises a first bridge portion surface 231 and a second bridge portion surface 232. The first bridge portion surface 231 is opposite the second bridge portion surface 232. The heat-dissipation member wedging portion 239 is formed on the first bridge portion surface 231. The second bridge portion surface 232 faces the heat-dissipation member plate 24 and abuts the restriction member 301.

With reference to FIG. 2C, in one embodiment, the restriction member 301 further comprises a restriction member protruding stage 33. The restriction member protruding stage 33 protrudes toward the heat-dissipation member plate 24. The restriction member protruding stage 33 is adapted to abut the heat-dissipation member plate 24 to compensate the manufacturing tolerance in the first direction Z and to prevent the restriction member 301 from loosen.

With reference to FIG. 2C, in one embodiment, in the restricted state, the restriction member hook 32 is located on one side of the bridge portion 23, and the restriction member protruding stage 33 is located on the other side of the bridge portion 23.

With reference to FIG. 2C, in one embodiment, the heat-dissipation member plate 24 comprises a plate rib 241, and the plate rib 241 is adapted to abut the restriction member protruding stage 33 to compensate the manufacturing tolerance in the first direction Z and to prevent the restriction member 301 from loosen.

With reference to FIG. 2C, in one embodiment, the heat-dissipation member plate 24 comprises two heat-dissipation member guiding portions 242. The restriction member 301 comprises two restriction member sliding portions 351. The restriction member sliding portions 351 are adapted to slide along the heat-dissipation member guiding portions 242.

With reference to FIG. 2C, in one embodiment, the heat-dissipation member plate 24 comprises a plate protruding stage 243. The heat-dissipation member guiding portions 242 are located on two sides of the plate protruding stage 243, and the plate rib 241 is formed on the plate protruding stage 243.

Figure 3:
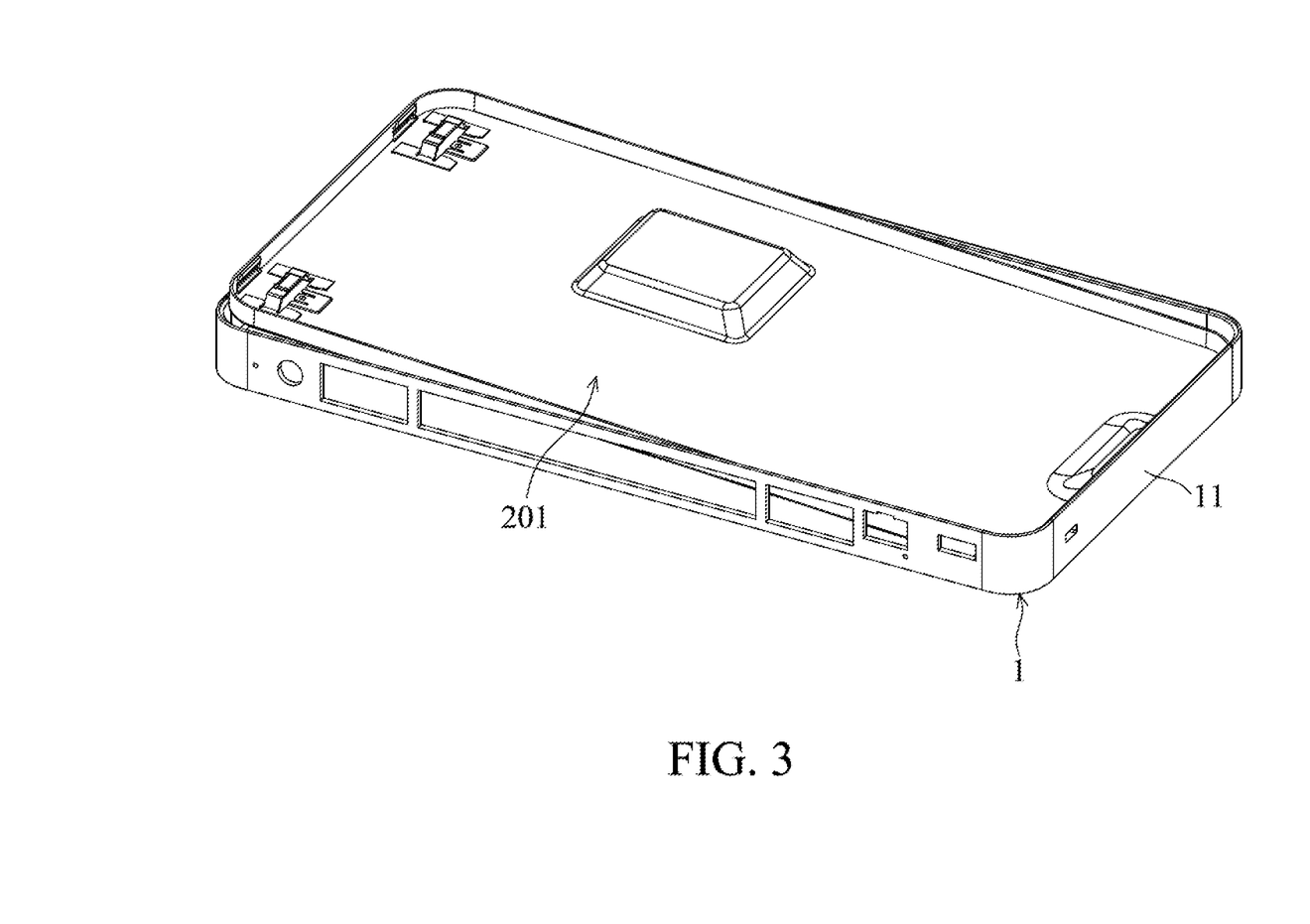
FIG. 3 shows the assembling process of the electronic device of the first embodiment of the invention.

FIG. 3 shows the assembling process of the electronic device of the first embodiment of the invention. With reference to FIGS. 1A, 1B and 3, in the process for assembling the electronic device of the first embodiment of the invention, first, the heat-dissipation member connection portion 21 on one side of the heat-dissipation member 201 is connected to the first sidewall connection portion 111 (FIGS. 1A and 3). Next, another side of the heat-dissipation member 201 is rotated to be disposed into the housing 1. Then, the restriction member 301 is wedged into the heat-dissipation member 201, and is wedged into the second sidewall connection portion 121. The heat-dissipation member 201 is therefore assembled to the housing 1.

In the first embodiment, the restriction member 301 affixes the heat-dissipation member 201 to the housing 1 by wedging. Therefore, the heat-dissipation member 201 is firmly assembled with the housing 1. When the electronic device is desired to be repaired, the heat-dissipation member 201 can be easily detached from the housing 1.

Figure 4A:
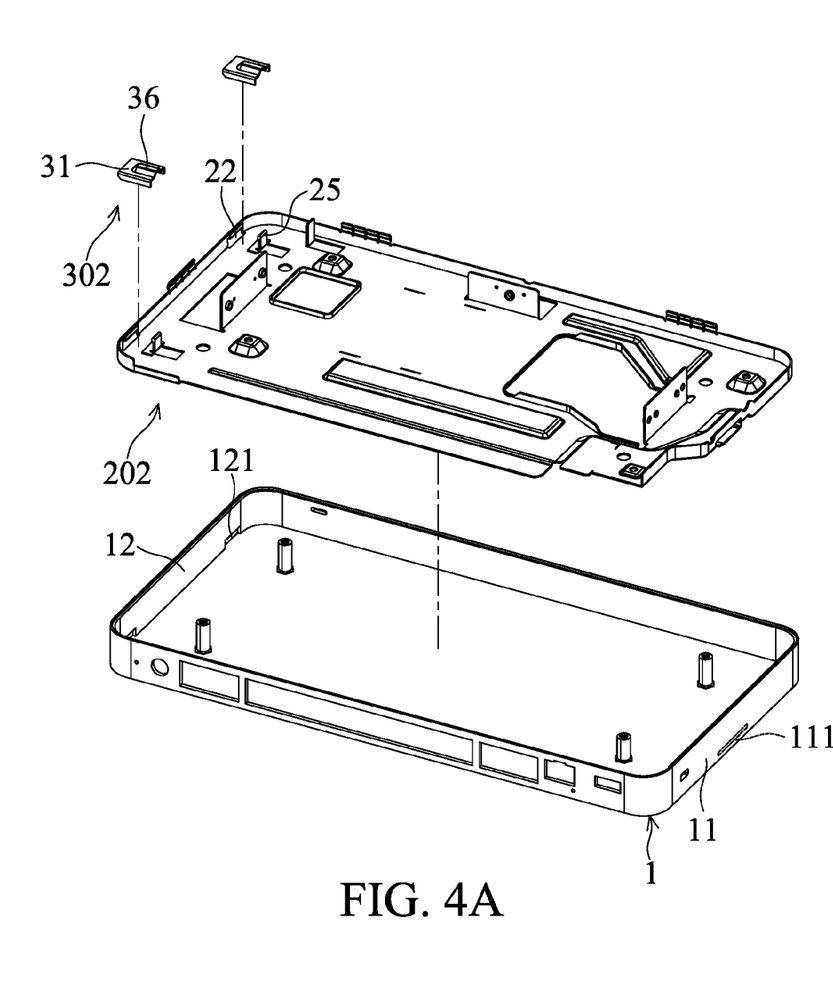
FIG. 4A is an exploded view of an electronic device with a heat-dissipation structure of a second embodiment of the invention.
Figures 4B, 4C:
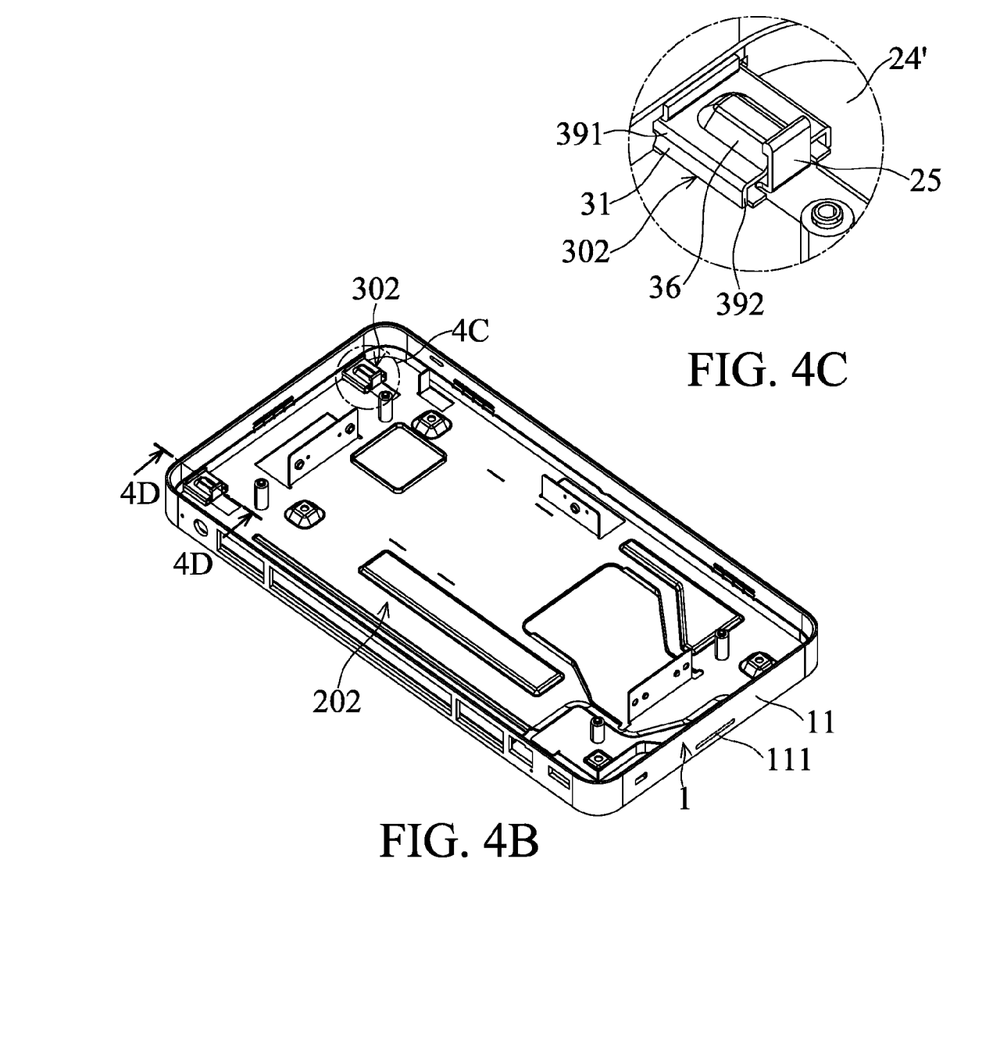
FIG. 4B is an assembled view of the electronic device of the second embodiment of the invention.
FIG. 4C is an enlarged view of the portion 4C of FIG. 4B.
Figure 4D:
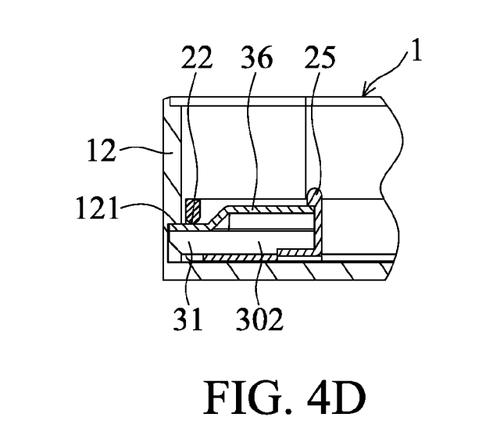
FIG. 4D shows the heat-dissipation member connected to the second sidewall of the embodiment of the invention.

FIG. 4A is an exploded view of an electronic device with a heat-dissipation structure of a second embodiment of the invention. FIG. 4B is an assembled view of the electronic device of the second embodiment of the invention. FIG. 4C is an enlarged view of the portion 4C of FIG. 4B. FIG. 4D shows the heat-dissipation member connected to the second sidewall of the embodiment of the invention. With reference to FIGS. 4A, 4B, 4C and 4D, in one embodiment, the restriction member 302 comprises a restriction member protrusion 36 and a restriction member connection portion 31. The heat-dissipation member 302 comprises a heat-dissipation member through hole 22 and a heat-dissipation member hook 25. The restriction member connection portion 31 passes through the heat-dissipation member through hole 22 and is connected to the second sidewall connection portion 121, and the restriction member protrusion 36 is wedged into the heat-dissipation member hook 25.

With reference to FIG. 4C, in one embodiment, a first side 391 of the restriction member 302 is connected to the second sidewall connection portion 121. A second side 392 of the restriction member 302 is restricted by the heat-dissipation member hook 25. The first side 391 is opposite the second side 392.

Figure 4E:
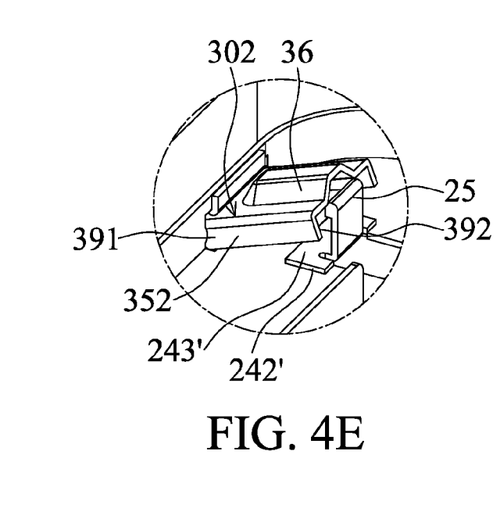
FIG. 4E shows the restriction member of the second embodiment of the invention assembled with the heat-dissipation member.

FIG. 4E shows the restriction member of the second embodiment of the invention assembled with the heat-dissipation member. With reference to FIGS. 4C and 4E, in one embodiment, the heat-dissipation member plate 24' comprises a plate protruding stage 243' and two heat-dissipation member guiding portions 242'. The restriction member 302 comprises two restriction member sliding portions 352. The restriction member sliding portions 352 protrude in the opposite direction than the restriction member protrusion 36. The restriction member sliding portions 352 are adapted to slide along the heat-dissipation member guiding portions 242'. The heat-dissipation member guiding portions 242' abut two sides of the plate protruding stage 243'.

With reference to FIGS. 4C, 4D and 4E, in one embodiment, the heat-dissipation member hook 25 is formed on the plate protruding stage 243'. During assembling the restriction member 302 to the heat-dissipation member, the first side 391 of the restriction member 302 is connected to the second sidewall connection portion 121. Then, the second side 392 of the restriction member 302 is pressed to be connected to the heat-dissipation member hook 25.

In the second embodiment, the restriction member 302 affixes the heat-dissipation member 202 to the housing 1 by wedging. Therefore, the heat-dissipation member 202 is firmly assembled with the housing 1. When the electronic device is desired to be repaired, the heat-dissipation member 202 can be easily detached from the housing 1.

Figure 5A:
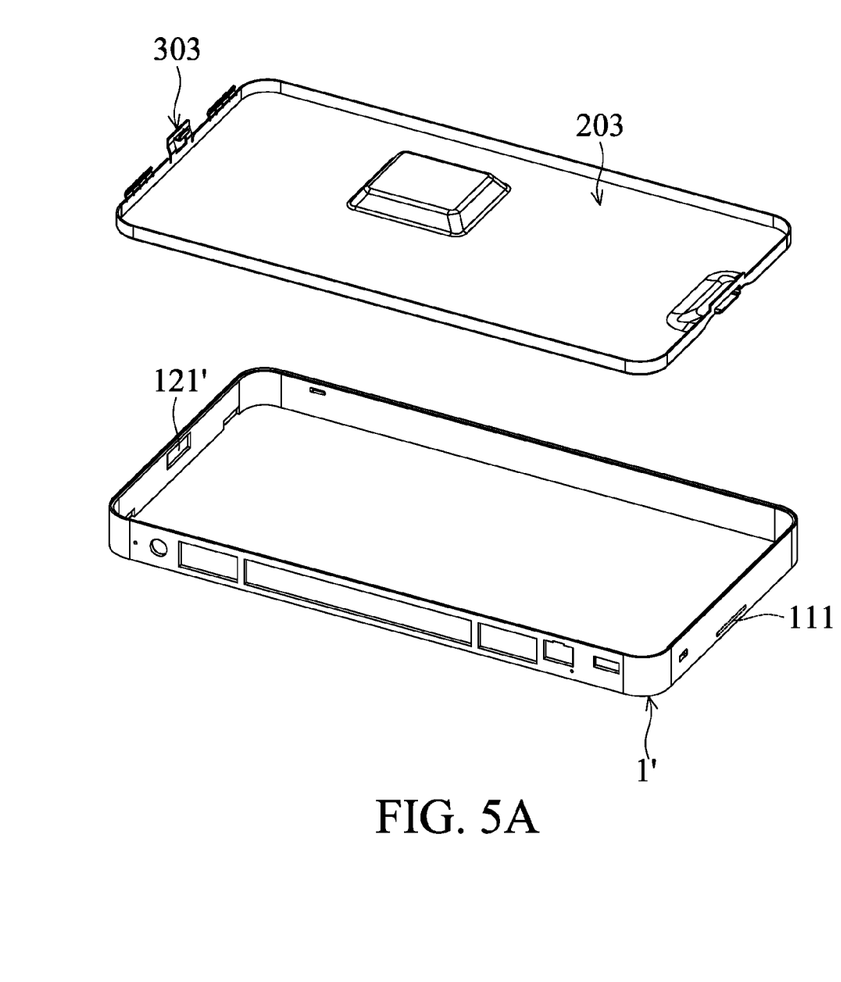
FIG. 5A is an exploded view of an electronic device with a heat-dissipation structure of a third embodiment of the invention.
Figure 5B:
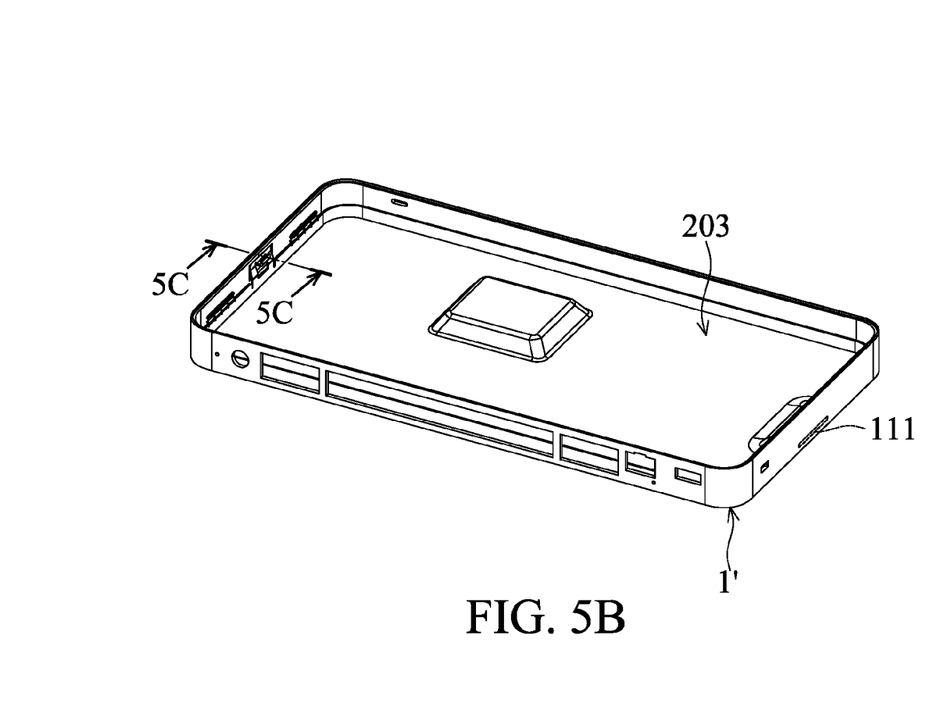
FIG. 5B is an assembled view of the electronic device of the third embodiment of the invention.
Figure 5C:
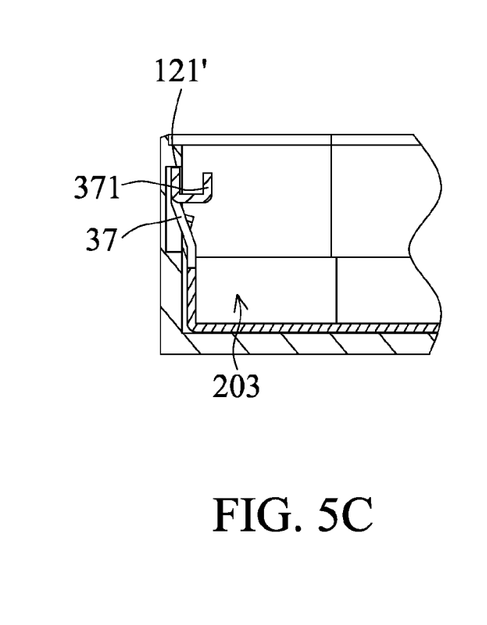
FIG. 5C is a cross sectional view along the direction 5C-5C of FIG. 5B.

FIG. 5A is an exploded view of an electronic device with a heat-dissipation structure of a third embodiment of the invention. FIG. 5B is an assembled view of the electronic device of the third embodiment of the invention. FIG. 5C is a cross sectional view along the direction 5C-5C of FIG. 5B. With reference to FIGS. 5A, 5B and 5C, in one embodiment, the restriction member 303 is integrally formed on the heat-dissipation member 203. The restriction member 303 comprises a cantilever beam 37. One end of the cantilever beam 37 is connected to the heat-dissipation member 203. The other end of the cantilever beam 37 is adapted to be wedged into the second sidewall connection portion 121' of the housing 1'.

With reference to FIG. 5C, in one embodiment, the second sidewall connection portion 121' comprises a second sidewall recess (121'), and the cantilever beam 37 extends into the second sidewall recess (121') and is wedged into the second sidewall recess (121'). In one embodiment, the restriction member 303 comprises a grip 371. The grip 371 is formed on the cantilever beam 37. The cantilever beam 37 is rotated to be separated from the second sidewall recess (121') by pulling on the grip 371. The assembling process of the third embodiment is similar to the previous embodiment, and the related description is therefore omitted.

In the third embodiment, the restriction member 303 affixes the heat-dissipation member 203 to the housing 1' by wedging. Therefore, the heat-dissipation member 203 is firmly assembled with the housing 1'. When the electronic device is desired to be repaired, the heat-dissipation member 203 can be easily detached from the housing 1'.

In one embodiment, the electronic device can be a wireless router. However, the disclosure is not meant to restrict the invention. The disclosure of the invention can be utilized to other electronic devices.

Utilizing the electronic device of the embodiment of the invention, the restriction member affixes the heat-dissipation member to the housing by wedging. The time and effort required for assembly is reduced. The reliability of the produce is improved. Additionally, the heat-dissipation member can easily be detached from the housing and be recycled.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with a heat-dissipation structure, comprising:
    a housing, comprising a first sidewall and a second sidewall, wherein the first sidewall comprises a first sidewall connection portion, and the second sidewall comprises a second sidewall connection portion;
    a heat-dissipation member, comprising a heat-dissipation member connection portion, wherein the heat-dissipation member connection portion is detachably connected to the first sidewall connection portion, and the first sidewall connection portion restricts freedom of movement of the heat-dissipation member connection portion in a first direction;
    a restriction member, disposed on the heat-dissipation member, wherein the restriction member is wedged into the second sidewall connection portion, and the second sidewall connection portion restricts the freedom of movement of the restriction member in the first direction,
    wherein in a restricted state, the restriction member is wedged into the heat-dissipation member, and the restriction member is wedged into the second sidewall connection portion simultaneously.

2. The electronic device as claimed in claim 1, wherein the first sidewall connection portion comprises a first sidewall recess, the heat-dissipation member connection portion comprises a heat-dissipation member protrusion, and the heat-dissipation member protrusion is adapted to be inserted into the first sidewall recess.

3. The electronic device as claimed in claim 1, wherein the restriction member comprises a restriction member hook and a restriction member connection portion, the heat-dissipation member comprises a heat-dissipation member through hole and a heat-dissipation member wedging portion, the restriction member connection portion passes through the heat-dissipation member through hole and is connected to the second wall connection portion, and the restriction member hook is wedged into the heat-dissipation member wedging portion.

4. The electronic device as claimed in claim 3, wherein the heat-dissipation member comprises a bridge portion and a heat-dissipation member plate, the heat-dissipation member wedging portion is formed on the bridge portion, the bridge portion is formed on the heat-dissipation member plate, and the restriction member extends between the bridge portion and the heat-dissipation member plate.

5. The electronic device as claimed in claim 4, wherein the bridge portion comprises a first bridge portion surface and a second bridge portion surface, the first bridge portion surface is opposite the second bridge portion surface, the heat-dissipation member wedging portion is formed on the first bridge portion surface, and the second bridge portion surface faces the heat-dissipation member plate and abuts the restriction member.

6. The electronic device as claimed in claim 5, wherein the restriction member further comprises a restriction member protruding stage, the restriction member protruding stage protrudes toward the heat-dissipation member plate, and the restriction member protruding stage is adapted to abut the heat-dissipation member plate.

7. The electronic device as claimed in claim 6, wherein in the restricted state, the restriction member hook is located on one side of the bridge portion, and the restriction member protruding stage is located on the other side of the bridge portion.

8. The electronic device as claimed in claim 6, wherein the heat-dissipation plate comprises a plate rib, and the plate rib is adapted to abut the restriction member protruding stage.

9. The electronic device as claimed in claim 8, wherein the heat-dissipation member plate comprises two heat-dissipation member guiding portions, the restriction member comprises two restriction member sliding portions, and the restriction member sliding portions are adapted to slide along the heat-dissipation member guiding portions.

10. The electronic device as claimed in claim 9, wherein the heat-dissipation member plate comprises a plate protruding stage, the heat-dissipation member guiding portions are located on two sides of the plate protruding stage, and the plate rib is formed on the plate protruding stage.

11. The electronic device as claimed in claim 1, wherein the restriction member comprises a restriction member protrusion and a restriction member connection portion, the heat-dissipation member comprises a heat-dissipation member through hole and a heat-dissipation member hook, the restriction member connection portion passes through the heat-dissipation member through hole and is connected to the second sidewall connection portion, and the restriction member protrusion is wedged into the heat-dissipation member hook.

12. The electronic device as claimed in claim 11, wherein a first side of the restriction member is connected to the second sidewall connection portion, and a second side of the restriction member is restricted by the heat-dissipation member hook, and the first side is opposite the second side.

13. The electronic device as claimed in claim 12, wherein the heat-dissipation member plate comprises a plate protruding stage and two heat-dissipation member guiding portions, the restriction member comprises two restriction member sliding portions, a protruding direction of the restriction member sliding portions is opposite a protruding direction of the restriction member protrusion, the restriction member sliding portions are adapted to slide along the heat-dissipation member guiding portions, and the heat-dissipation member guiding portions abut two sides of the plate protruding stage.

14. The electronic device as claimed in claim 13, wherein the heat-dissipation member hook is formed on the plate protruding stage.

15. An electronic device with a heat-dissipation structure, comprising:
    a housing, comprising a first sidewall and a second sidewall, wherein the first sidewall comprises a first sidewall connection portion, and the second sidewall comprises a second sidewall connection portion;
    a heat-dissipation member, comprising a heat-dissipation member connection portion, wherein the heat-dissipation member connection portion is detachably connected to the first sidewall connection portion, and the first sidewall connection portion restricts freedom of movement of the heat-dissipation member connection portion in a first direction;
    a restriction member, disposed on the heat-dissipation member, wherein the restriction member is wedged into the second sidewall connection portion, and the second sidewall connection portion restricts the freedom of movement of the restriction member in the first direction;
    wherein the restriction member is integrally formed on the heat-dissipation member, the restriction member comprises a cantilever beam, one end of the cantilever beam is connected to the heat-dissipation member, and the other end of the cantilever beam is adapted to be wedged into the second sidewall connection portion, wherein the restriction member comprises a grip, the grip is formed on the cantilever beam, and the cantilever beam is rotated to be separated from the second sidewall recess by pulling on the grip.

16. The electronic device as claimed in claim 15, wherein the second sidewall connection portion comprises a second sidewall recess, and the cantilever beam extends into the second sidewall recess and is wedged into the second sidewall recess.

* * * * *